US00RE42481E

(19) United States
(12) Reissued Patent
Wang et al.

(10) Patent Number: US RE42,481 E
(45) Date of Reissued Patent: Jun. 21, 2011

(54) SEMICONDUCTOR YIELD MANAGEMENT SYSTEM AND METHOD

(75) Inventors: Weidong Wang, Union City, CA (US); Jonathan B. Buckheit, Atherton, CA (US); David W. Budd, Princeton, NJ (US)

(73) Assignee: Rudolph Technologies, Inc., Flanders, NJ (US)

(21) Appl. No.: 10/972,115

(22) Filed: Oct. 22, 2004

Related U.S. Patent Documents

Reissue of:
(64) Patent No.: 6,470,229
Issued: Oct. 22, 2002
Appl. No.: 09/458,185
Filed: Dec. 8, 1999

(51) Int. Cl.
*G06F 19/00* (2006.01)

(52) U.S. Cl. ..... 700/121; 700/108; 700/31; 700/103; 257/E21.525

(58) Field of Classification Search ..... 700/121, 700/108, 31, 29, 47, 103, 104, 3, 1; 703/2, 703/13; 706/45, 46, 60, 48, 904, 906, 42; 716/4; 257/E21.525
See application file for complete search history.

(56) References Cited

U.S. PATENT DOCUMENTS

| | | | | |
|---|---|---|---|---|
| 4,754,410 | A * | 6/1988 | Leech et al. | 706/45 |
| 5,727,128 | A * | 3/1998 | Morrison | 706/45 |
| 5,897,627 | A | 4/1999 | Leivian et al. | |
| 6,098,063 | A * | 8/2000 | Xie et al. | 706/60 |
| 6,336,086 | B1 * | 1/2002 | Perez et al. | 703/13 |

OTHER PUBLICATIONS

Ison et al., Semiconductor Manufacturing Conference Proceedings, 1997 IEEE Symposium on "Fault diagnosis of plasma etch equipment", San Francisco, Ca. published Oct. 6-8, 1997, pp. B49-B52.*
Irani et al. Expert, IEEE vol. 8, Issue 1, "Applying machine learning to semiconductor manufacturing", Feb. 1993, pp. 41-47.*
Famili et al., "Data Preprocessing and Intelligent Data Analysis," *Intelligent Data Analysis Journal*, pp. 1-28 (Mar. 24, 1997).
Lee et al., "Yield Analysis and Data Management Using Yield Manager™," *IEEE/SEMI Advanced Semiconductor Manufacturing Conference*, pp. 19-30 (1998).
Turney, P., "Data Engineering for the Analysis of Semiconductor Manufacturing Data," *Workshop on Data Engineering for Inductive Learning*, pp. 1-10 (Apr. 3, 1995).
"Quadrillion: Q-Yield Product Overview," Quadrillion Corporation (last accessed at http://web.archive.org/web/19971210064219/www.quadrillion.com/qyov... Feb. 5, 2009) 2 pages.

(Continued)

*Primary Examiner* — Ramesh B Patel
*Assistant Examiner* — Steven R Garland
(74) *Attorney, Agent, or Firm* — Harrington & Smith

(57) ABSTRACT

A system and method for yield management is disclosed wherein a data set containing one or more prediction variable values and one or more response values is input into the system. The system can pre-process the input data set to remove prediction variables with missing values and data sets with missing values. The pre-processed data can then be used to generate a model that may be a decision tree. The system can accept user input to modify the generated model. Once the model is complete, one or more statistical analysis tools can be used to analyze the data and generate a list of the key yield factors for the particular data set.

34 Claims, 7 Drawing Sheets

Amended

OTHER PUBLICATIONS

"Quadrillion: Training Services," Quadrillion Corporation (last accessed at http://web.archive.org/web/19971210064511/www.quadrillion.com/train.html Feb. 5, 2009) 2 pages.

Email from Dave Garrod at PDF Solutions, Inc. enclosing prior art for the yield analysis and data mining tool called Q-Yield, 1 page (Sent Feb. 5, 2009).

Friedhoff, et al., "Analysis of Intra-Level Isolation Test Structure, etc." Proc. IEEE 1989 Int. Conf. Micro. Test Struc., Mar, 1989, pp. 217-221,vol. 2, No. 1, Pittsburgh, PA.

Yang, Y-K., "EPAS: An Emitter Piloting Advisory Expert System, etc." IEEE Trans. Semicon. Mfg., May 1990, pp. 45-53, vol. 3, No. 2, US.

Lee, et al., "RTSPC: A Sofware Utility for Real-Time SPC, etc." IEEE Trans. Semicon. Mfg., Feb, 1995, pp. 17-25, vol. 8, No. 1, US.

Bergendahl, et al., "Optimization of Plasma Processing, etc." IBM. J. Res. Develop., Sep. 1982, pp. 580-589, vol. 26, No. 5, IBM, US.

Murthy, S., Automatic Construction of Decision Trees from Data: A Multi-Disciplinary Survey, Data Mining and Knowledge Dscovery, 1998, pp. 345-389, v. 2, Kluwer Aca. Pub., US.

Data Mining and the Case for Sampling: Solving Business Problems Using SAS Enterprise Miner Software, 1998, pp. 1-35, Sas Institute Inc., US.

Quinlan, J., Unknown Attribute Values in Induction in Segre, A. (Ed.), Proc. Sixth Intl. Machine Learning Workshop, 1989, Morgan Kaufmann, US.

Lee, F., et al., Yield Analysis and Data Management Using Yield Manager, 1998 IEEE/Semi Adv. Semi. Manuf. Conf., 1998, pp. 19-30, US.

Perez, R., et al., Machine Learning for a Dynamic Manufacturing Environment, ACM SIGICE Bulletin, 1994, pp. 5-9, v. 19, US.

* cited by examiner

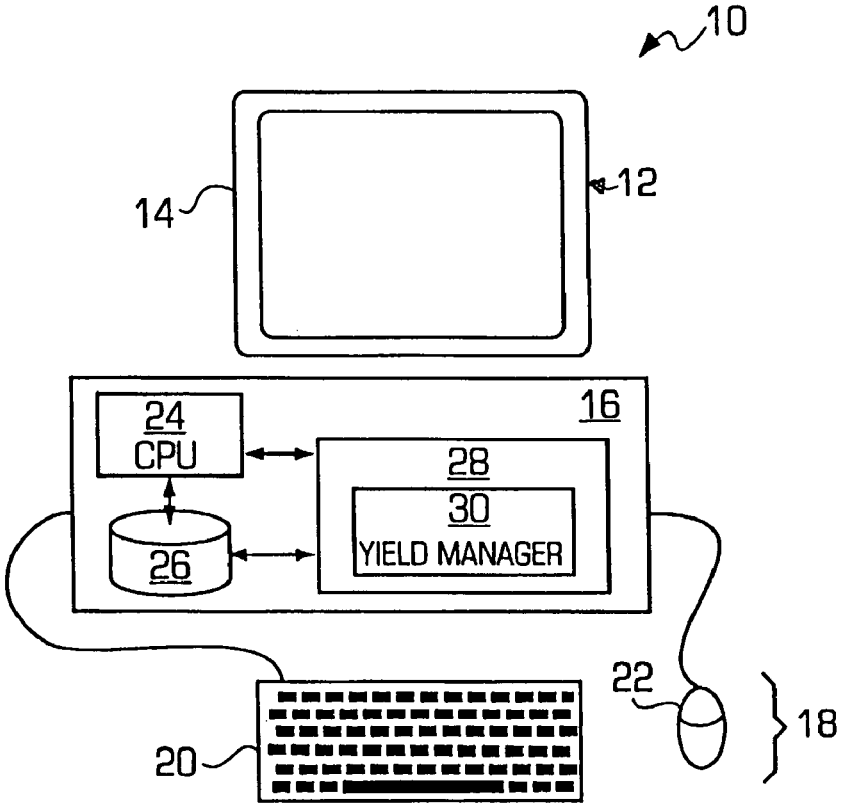
FIG. 1
Amended

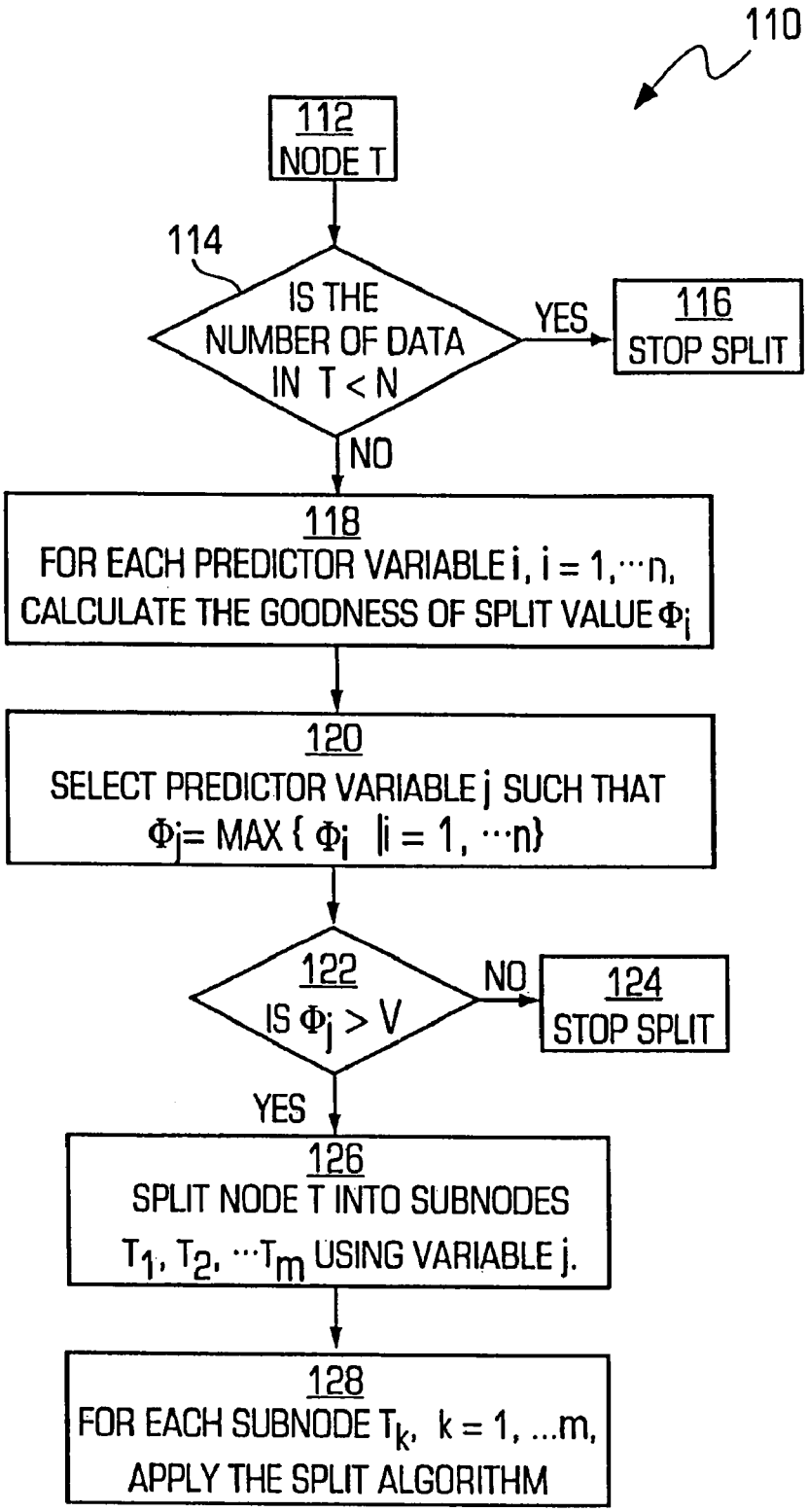
FIG. 6
Amended

SEMICONDUCTOR YIELD MANAGEMENT SYSTEM AND METHOD

Matter enclosed in heavy brackets [ ] appears in the original patent but forms no part of this reissue specification; matter printed in italics indicates the additions made by reissue.

BACKGROUND OF THE INVENTION

This invention relates generally to a system and method for managing a semiconductor process and in particular to a system and method for managing yield in a semiconductor process.

The semiconductor industry is continually pushing toward smaller and smaller geometries of the semiconductor devices being produced since smaller devices generate less heat and operate at a higher speed than larger devices. Currently, a single chip may contain over one billion patterns. The semiconductor manufacturing process is extremely complicated since it involves hundreds of processing steps. A mistake or small error at any of the process steps or tool specifications may cause lower yield in the final semiconductor product, wherein yield may be defined as the number of functional devices produced by the process as compared to the theoretical number of devices that could be produced assuming no bad devices. Improving yield is a critical problem in the semiconductor industry and has a direct economic impact to the semiconductor industry. In particular, a higher yield translates into more devices that may be sold by the manufacturer.

Semiconductor manufacturing companies have been collecting data for a long time about various process parameters in an attempt to improve the yield of the semiconductor process. Today, an explosive growth of database technology has contributed to the yield analysis that each company follows. In particular, the database technology has far outpaced the yield management ability when using conventional statistical methods to interpret and relate yield to major yield factors. This has created a need for a new generation of tools and techniques for automated and intelligent database analysis for yield management.

Current conventional yield management systems have a number of limitations and disadvantages which make them less desirable to the semiconductor industry. For example, the conventional systems may require some manual processing which slows the analysis and makes it susceptible to human error. In addition, these conventional systems may not handle both continuous and categorical yield management variables. Some conventional systems cannot handle missing data elements and do not permit rapid searching through hundreds of yield parameters to identify key yield factors. Some conventional systems output data that is difficult to understand or interpret even by knowledgeable semiconductor yield management people. In addition, the conventional systems typically process each yield parameter separately, which is time consuming and cumbersome and cannot identify more than one parameter at a time.

Thus, it is desirable to provide a yield management system and method which solves the above limitations and disadvantages of the conventional systems and it is to this end that the present invention is directed.

SUMMARY OF THE INVENTION

The yield management system and method in accordance with the invention may provide many advantages over conventional methods and systems which make the yield management system and method more useful to semiconductor device manufacturers. In particular, the system may be fully automated and easy to use so that no extra training is necessary to make use of the yield management system. In addition, the system handles both continuous (e.g., temperature) and categorical (e.g., Lot 1, Lot 2, etc.) variables. The system also automatically handles missing data during a pre-processing step. The system can rapidly search through hundreds of yield parameters and generate an output indicating the one or more key yield factors/parameters. The system generates an output (a decision tree) that is easy to interpret and understand. The system is also very flexible in that it permits prior yield parameter knowledge (from users) to be easily incorporated into the building of the model in accordance with the invention. Unlike conventional systems, if there is more than one yield factor/parameter affecting the yield of the process, the system can identify all of the parameters/factors simultaneously so that the multiple factors are identified during a single pass through the yield data.

In accordance with a preferred embodiment of the invention, the yield management method may receive a yield data set. When a data set comes in, it first goes through a data preprocessing step in which the validity of the data in the data set is checked and cases or parameters with missing data are eliminated. Using the cleaned up data set, a Yield Mine model is built during a model building step. Once the model is generated automatically by the yield management system, the model may be modified by one or more users based on their experience or prior knowledge of the data set. Once the model has been modified, the data set may be processed using various statistical analysis tools to help the user better understand the relationship between the response and predict variables.

BRIEF DESCRIPTION OF THE DRAWINGS

FIG. 1 is a diagram illustrating an example of a yield management system in accordance with the invention implemented on a personal computer;

FIG. 6 is a flowchart illustrating a recursive node splitting method in accordance with the invention;

DETAILED DESCRIPTION OF A PREFERRED EMBODIMENT

Figure 2:
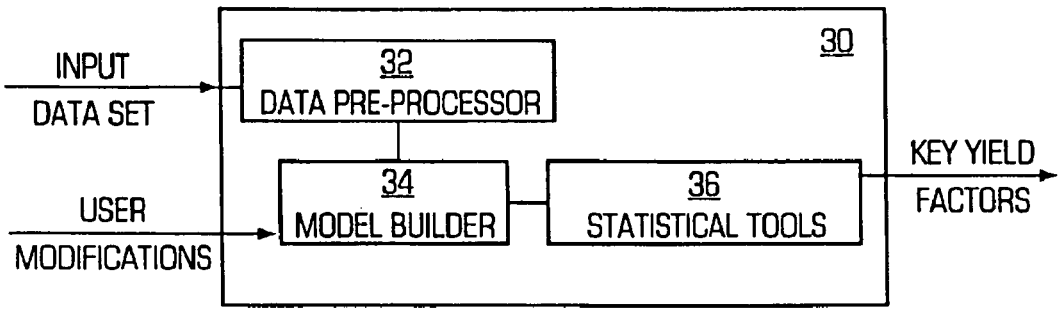
FIG. 2 is a block diagram illustrating more details of the yield management system in accordance with the invention.

The invention is particularly applicable to a computer-implemented software-based yield management system and it is in this context that the invention will be described. It will be appreciated, however, that the system and method in accordance with the invention has greater utility since it may be implemented in hardware or may incorporate other modules or functionality not described herein.

FIG. 1 is a block diagram illustrating an example of a yield management system 10 in accordance with the invention implemented on a personal computer 12. In particular, the personal computer may include a display unit 14, that may be a cathode ray tube (CRT), a liquid crystal display or the like, a processing unit 16 and one or more input/output devices 18 that permit a user to interact with the software application being executed by the personal computer. In this example, the input/output devices may include a keyboard 20 and a mouse 22, but may also include other peripheral devices such as printers, scanners and the like. The processing unit 16 may further include a central processing unit (CPU) 24, a persistent storage device 26, such as a hard disk, a tape drive, an optical disk system, a removable disk system or the like and a memory 28. The CPU may control the persistent storage device and memory. Typically, a software application may be permanently stored in the persistent storage device and then may be loaded into the memory 28 when the software application is going to be executed by the CPU. In the example shown, the memory 28 may contain a yield manager 30. The yield manager may be implemented as one or more software applications that are executed by the CPU.

In accordance with the invention, the yield management system may also be implemented using hardware and may be implemented on different types of computer systems, such as client/server systems, web servers, mainframe computers, workstations and the like. Now, more details of the implementation of the yield management system in software will be described.

FIG. 2 is block diagram illustrating more details of the yield management system 30 in accordance with the invention. In particular, the yield management system may receive a data set containing various types of semiconductor process data including continuous/numerical data, such as temperature or pressure, and categorical data, such as the lot number of the particular device. The yield management system in accordance with the invention may process the data set, generate a model, apply one or more statistical tools to the model and data set and generate an output that may indicate, for example, the key factors/parameters that affected the yield of the devices that generated the current data set.

In more detail, the data may be input to a data preprocessor 32 that may validate the data and remove any missing data records. The output from the data preprocessor may be fed into a model builder 34 so that a model of the data set may be automatically generated by the system. Once the system has generated a model, the user may enter model modifications into the model builder to modify the model based on, for example, past experience with the particular data set. Once the user modifications have been incorporated into the model, a final model is output and made available to a statistical tool library 36. The library may contain one or more different statistical tools that may be used to analyze the final model. The output of the system may be, for example, a listing of one or more factors/parameters that contributed to the yield of the devices that generated the data set being analyzed. As described above, the system is able to simultaneously identify multiple yield factors. Now, a yield management method in accordance with the invention will be described.

Figure 3:
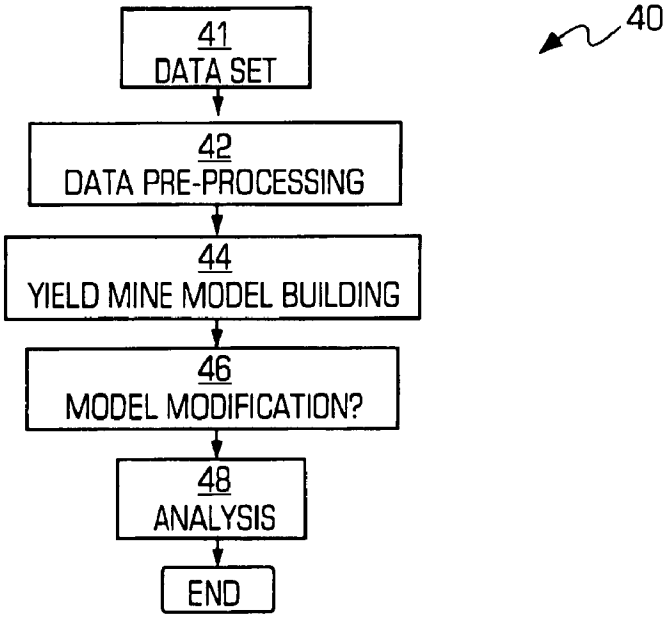
FIG.3 is a flowchart illustrating an example of a yield management method in accordance with the invention.

FIG. 3 is a flowchart illustrating an example of a yield management method 40 in accordance with the invention. The method may include receiving an input data set in step 41 and preprocessing the input data set in step 42 to clean up the data set (e.g., validate the data and remove any data records containing missing, erroneous or invalid data elements). In step 44, the cleaned up data set may be used to build a model and the user may enter model modifications in step 46. Once the model is complete, it may be analyzed in step 48 using a variety of different statistical tools to generate yield management information such as key yield factors. Each of the above steps of the method will now be described in more detail to better understand the invention. In particular, the data preprocessing step in accordance with the invention will now be described.

The data preprocessing step 42 helps to clean up the incoming data set so that the later analysis may be more fruitful. The yield management system in accordance with the invention can handle data sets with complicated data structures. A yield data set typically has hundreds of different variables. These variables may include both a response variable, Y, and predictor variables, $X_1, X_2, \ldots, X_m$, that may be of a numerical type or a categorical type. A variable is a numerical type variable if its values are real numbers, such as different temperatures at different [time] *times* during the process. A variable is a categorical type variable if its values are of a set of finite elements not necessarily having any natural ordering. For example, a categorical variable could [takes] *take* values in a set of {MachineA, MachineB, MachineC} or values of (Lot1, Lot2 or Lot3).

It is very common for a yield data set to have missing values. The data pre-processing step removes the cases or variables having missing values. In particular, the preprocessing first may remove all predictor variables that are "bad". By "bad", it is understood that either a variable has too much missing data, ≧MS, or, for a categorical variable, if the variable has too many distinct classes, ≧DC. In accordance with the invention, both MS and DC are user defined thresholds so that the user may set these values and control the preprocessing of the data. In a preferred embodiment, the default [value] *values* are MS=0.05×N, DC=32, where N is the total number of cases in the data set.

Once the "bad" predictor variables are removed, then, for the remaining data set, data preprocessing may remove all cases with missing data. If one imagines that the original data set is a matrix with each column representing a single variable, then data preprocessing first removes all "bad" columns (variables) and then removes "bad rows" (missing data) in the remaining data set with the "good" columns.

Figure 4:
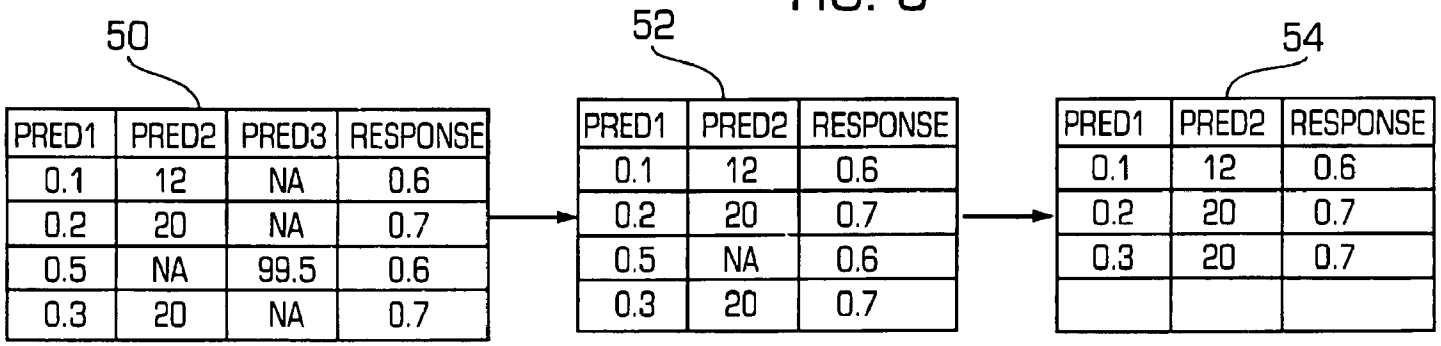
FIG. 4 is a diagram illustrating the data preprocessing procedure in accordance with the invention.

FIG. 4 is a diagram illustrating an example of the data preprocessing procedure in accordance with the invention. In particular, for this example, the MS variable is set to 2. FIG. 4 shows an original data set 50, a data set 52 once bad columns have been removed and a data set 54 once the bad rows have been removed. As shown, the original data set 50 may include three predictor variables (Pred1, Pred2 and Pred3) and a numerical variable (Response) wherein three values for Pred3 are unknown and one value for Pred2 is unknown. Since the MS is set to 2 in this example, any predictor variables that have more than two unknown values are removed. Thus, as shown in the processed data set 52, the column containing the Pred3 variable is removed from the data set. Since the Pred2 variable [have] *has* only one missing value, it is not removed from the data set in this step. Next, any bad rows of data are removed from the data set. In the example shown in FIG. 4, the row with a Pred1 value of 0.5 is removed since the row contained an unknown value for variable Pred2. Thus, once the preprocessing has been completed, the data set 54 contains no missing values so that the statistical analysis may produce better results. Now, the model building step in accordance with the invention will be described in more detail.

The yield management system uses a decision tree-based method. In particular, the method partitions the data set, D, into sub-regions. The tree structure may be a hierarchical way to describe a partition of D. It is constructed by successively splitting nodes (as described below), starting with the root node (D), until some stopping criteria are met and the node is declared a terminal node. For each terminal node, a value or a class is assigned to all the cases within the node. Now, the node splitting method and example of the decision tree will be described in more detail.

Figure 5:
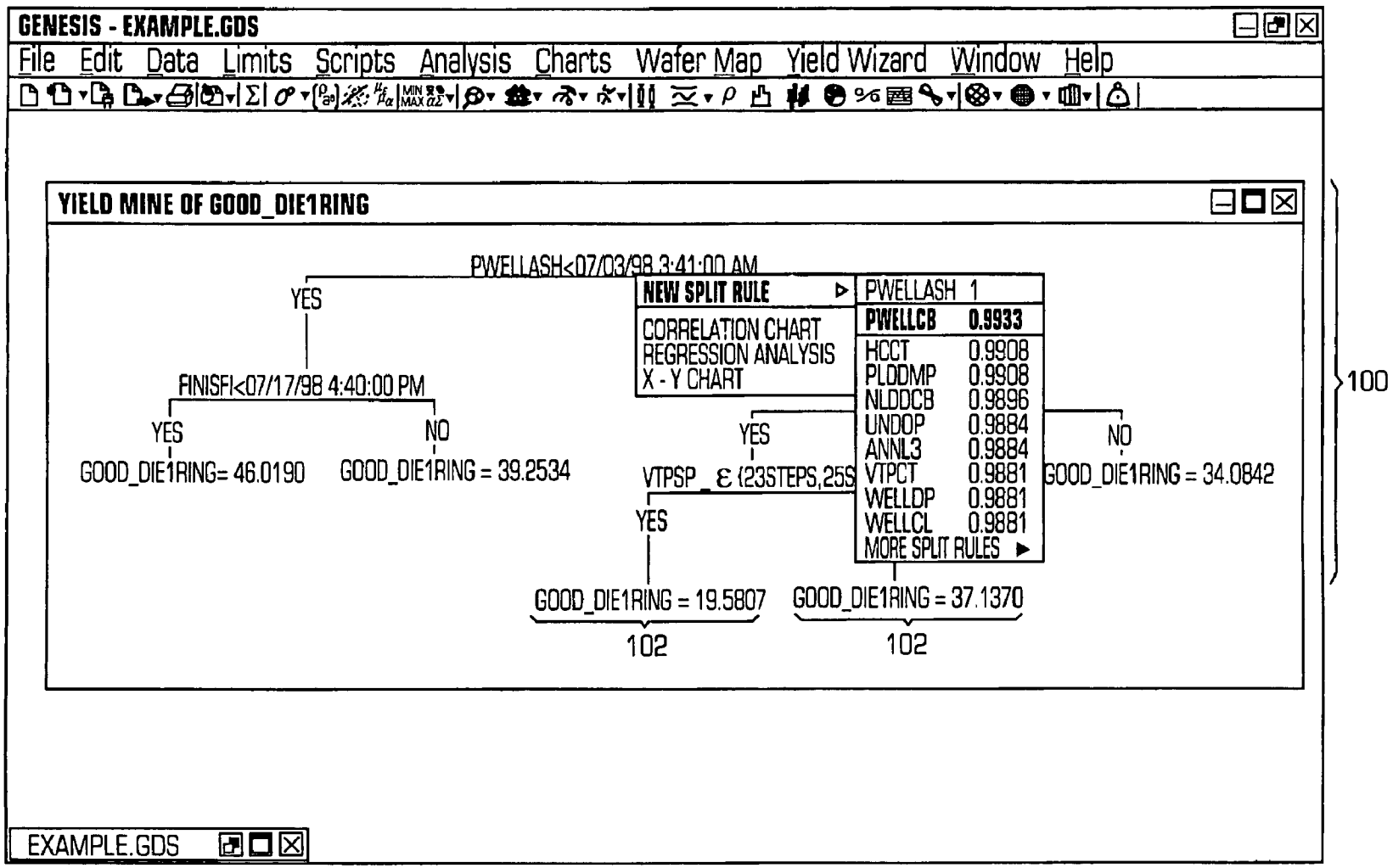
FIG. 5 illustrates an example of a yield parameter being selected by the user and a tree node being automatically split or manually split in accordance with the invention.

FIG. 5 shows an example of a Yield Mine model decision tree 100 generated by the system. In this example, the data set contains 233 process step variables, 233 time variables corresponding to each process step, and 308 parametric test variables. All of the variables are not shown in FIG. 5 for clarity. All of these variables are used in the Yield Mine model building as predictor variables. The response variable in this example is named "Good DielRing" and represents the number of good dies around the edge of a wafer produced during a particular process run.

In this example, out of all 774 predictor variables, the Yield Mine system using the decision tree prediction, identifies one or more variables as key yield factors. In this example, the key yield factor variables are PWELLASH, FINISFI, TI_TIN_RTP_, and VTPSP_. In this example, PWELLASH and FINISFI are time variables associated with the process variables PWELLASH_and FINISFI_and [$TI_{13}$ TIN_RTP_] *TI_TIN_RTP*_and VTPSP_are process variables. Note that, for each terminal node 102 in the decision tree, the value of the response variable at that terminal node is shown so that the user can view the tree and easily determine which terminal node (and thus which predictor variables) result in the best value of the response variable.

In the tree structure model in accordance with the invention, if a tree node is not terminal, it has a splitting criterion for the construction of its sub-nodes as will be described in more detail below with reference to FIG. 6. For example, the root node is split into two sub-nodes depending on the criterion of whether PWELLASH is before or after 3:41:00 am, 07/03/98. If PWELLASH is before 3:41:00 am, 07/03/98, the case is put in the left sub-node. Otherwise, it is put in the right sub-node. The left sub-node is further split into its sub-nodes using the criterion FINISFI <07/17/98 4:40:00 pm. The right sub-node is also further split into its sub-nodes using the criterion TI_TIN_RTP_=2RTP, where [$TI_{13}$TIN_RTP_] *TI_TIN_RTP*_is a process step parameter and 2RTP is one of its specification if the variable is continuous. For a terminal node, the average value of all cases under the node is shown. In this example, it is pretty clear to the user that when PWELLASH<07/03/98 3:41:00 am, the yield is higher, especially when the criterion FINISFI<07/17/98 4:40:00 pm is also satisfied. The worst case happens when PWELLASH>07/03/98 3:41:00 am, and TI_TIN_RTP_<>1RTP, and VTPSPE_$\epsilon$\{23STEP, 25STEP, 26STEP\}.

To find the proper stopping criteria for tree construction is a difficult problem. To deal with the problem we first overgrow the tree and then apply cross validation techniques to prune the tree. Pruning the tree is described in detail in the following sections. To grow an over sized tree, the method may keep splitting nodes in the tree until all cases in the node having the same response value, or the number of cases in the node is less than a user defined threshold, $n_0$. The default in our algorithm is $n_0$=max\{5, floor(0.02×N)\} where N is the total number of cases in D, and the function floor(x) gives the biggest integer that is less than or equal to x. Now, the construction of the decision tree and the method for splitting tree nodes in accordance with the invention will be described.

FIG. 6 is a flowchart illustrating a method 110 for splitting nodes of a decision tree in accordance with the invention. In step 112, a particular node of the decision tree, T, is selected. The process is then repeated for each node of the tree. In step 114, the method may determine if the number of data values in node T is less than a predetermined threshold, N. If the number of data values is less than N, then the splitting for the particular node is stopped in step 116 and the next node may be processed. If the number of data values for the node is not less than N, then in step 118, the processing of the particular node is continued. In particular, for each predictor variable, i, where i=1 . . . n, the "goodness" of the split value, $\Phi_i$, is calculated. Then, in step 120, the predictor variables, j, are selected such that $\Phi_j$=MAX $\{\Phi_i|i=1, \ldots n\}$. In step 122, the method may determine if $\Phi_j$>V wherein V is a user-defined threshold value as described below. If $\Phi_j$ is not greater than the threshold value, then in step 124, the splitting process for the particular node is stopped and the processing begins with the next node.

If $\Phi_j$>V, then in step 126, the node, T, is split into one or more sub-nodes, $T_1, T_2, \ldots, T_m$, based on the variable j. In step 128, for each sub-node, $T_k$ where k=1, . . . , m, the same node splitting method is applied. In this manner, each node is processed to determine if splitting is appropriate and then each sub-node created during a split is also checked for susceptibility to splitting as well. Thus, the nodes of the decision tree are split in accordance with the invention. Now, more details of the decision tree construction and node splitting method will be described.

A decision tree is built to find relations between the response variable and the predictor variables. Each split, S, of a node, T, partitions the node into m subnodes $T_1, T_2, \ldots, T_m$, in hopes that the subnodes are less "noisy" than T as defined below. To quantify this idea, a real-value function that measures the noisiness of a node T, g(T), may be defined wherein $N^T$ denotes the number of cases in T, and $N^{T_i}$ denotes the number of cases in the ith sub-node $T_i$. The partition of T is exclusive, therefore, $\Sigma_{i=1}{}^m N^{T_i}=N^T$. Next, the method may define $\Phi$(S) to be the goodness of split function for a split, S, wherein:

$$\Phi(s) = g(T) - \frac{1}{N^T}\sum_{i=1}^{m} N^{T_i} g(T_i) \tag{1}$$

We say that the subnodes are less noisy than their ancestor if $\Phi$(S)>0. In Yield Mine, a node split depends only on one predictor variable. The method may search through all predictor variables, $X_1, X_2, \ldots, X_n$, one by one to find the best split based on each predictor variable. Then, the best split is the one to be used to split the node. Therefore, it is sufficient to explain the method by describing how to find the best split for a single predictor variable. Depending on the types of the response variable, Y, and the predictor variable, X, as being either categorical or numerical, there are four possible scenarios. Below, details for each scenario on how the split is constructed and how to assign a proper value or a class to a terminal node is described. Now, the case when Y and X are both categorical variables is described.

Y is Categorical and X is [Ategorical] *Categorical*

Suppose that Y takes values in the set $A=\{A_1, A_2, \ldots, A_k\}$, and X takes values in the set $B=\{B_1, B_2, \ldots, B_l\}$. In this case, only binary splits are allowed. That is, if a node is split, it produces 2 sub-nodes, a left sub-node, $T_L$, and a right sub-node, $T_R$. A split rule has the form of a question: Is $x\Sigma B_S$, where $B_S$ is a subset of B. If the answer to the question is yes, then the case is put in the left sub-node $T_L$. Otherwise it is put in the right sub-node $T_R$. There are $2^l$ different subsets of B. Therefore, there are $2^l$ different splits.

Let $N_i^T$ denote the number of class i cases in node T. The function which [measure] *measures* the noisiness of the node, g(T), is defined as:

$$g(T) = 1 - \sum_{i=1}^{k} \left(\frac{N_i^T}{N^T}\right)^2$$

Since there are only two sub-nodes, the goodness of split function, Φ(S), is:

$$\Phi(s) = g(T) - \frac{N^{T_L}}{N^T} g(T_L) - \frac{N^{T_R}}{N^T} g(T_R) \tag{3}$$

The method thus searches through all positions $2^l$ splits to find the one that minimizes Φ(S). Now, the case where Y is categorical and X is numerical will be described.

Y is Categorical and X is Numerical

Suppose that Y takes values in the set $A=\{A_1, A_2, \ldots, A_k\}$ and $x_1, x_2, \ldots, x_{N^T}$ denotes the numerical predictor variable in each case. The split in this case is also binary as above. We will again use $T_L$ and $T_R$ to denote the two sub-nodes of T. A split rule takes one of the two forms.

1) Is $x \leqq \alpha$?

2) Is $\alpha < x \leqq \beta$?

where α and β take values from the set $\{x_1, x_2, \ldots, x_{N^T}\}$. For each case, if the answer to the split rule is true, it is put in $T_L$. Otherwise it is put in $T_R$.

Now, we define $N^T$ and g(T) in the same way as in the previous scenario. Since a split in this case has one more parameter than a split *in* the first case above, the method may define $$\Phi(S) = \begin{cases} g(T) - \frac{N^{T_L}}{N^T} g(T_L) - \frac{N^{T_R}}{N^T} g(T_R) & \text{if S has form (1)} \\ c\left(g(T) - \frac{N^{T_L}}{N^T} g(T_L) - \frac{N^{T_R}}{N^T} g(T_R)\right) & \text{if S has form (2)} \end{cases}$$

wherein c is between 0 and 1 and can be set by the user. The default is 0.9. There are only finite split rules of form (1) and (2). The method thus searches through all possible splits to find the one that minimizes Φ(S). Now, the case where Y is numerical and X is categorical will be described.

Y is Numerical and X is Categorical

In this case, the split rule is the same as the first case. The only difference is the way in which the noiseness function, g(T), is defined. In particular, since Y is numerical, let $y_1, y_2, \ldots, y_{N^T}$ denote the response variable for all cases in T. g(T) is then defined as the $L^p$ norm of the empirical distribution function of Y in T. In particular, $$g(T) = \left(\sum_{i=1}^{N^T} (y_i - \bar{y})^p\right)^{\frac{1}{p}}, \text{ where } \bar{y} = \frac{1}{N^T}\sum_{i=1}^{N^T} y_i$$

Then, Φ(S) may be defined as:

$$\Phi(s) = g(T) - \frac{N^{T_L}}{N^T} g(T_L) - \frac{N^{T_R}}{N^T} g(T_R)$$

As in the first case, there are only *a* finite number of possible splits and the method searches through all possible splits to find the one that minimizes Φ(S). Now, a fourth case where Y and X are both numerical will be described.

Y is Numerical and X is Numerical

In this case, the split rule is defined the same way as in the second case above, and g(T) is defined the same way as in the third case. Thus, the method may search through all possible splits to come up with the split, S*, which minimizes Φ(S), where:

$$\Phi(S^*) = \begin{cases} g(T) - \frac{N^{T_L}}{N^T} g(T_L) - \frac{N^{T_R}}{N^T} g(T_R) & \text{if } S^* \text{ has form (1)} \\ c\left(g(T) - \frac{N^{T_L}}{N^T} g(T_L) - \frac{N^{T_R}}{N^T} g(T_R)\right) & \text{if } S^* \text{ has form (2)} \end{cases}$$

Then, a linear regression model, as set forth below, is fit $$y = a_0 + a_1 x + \epsilon, \tag{5}$$

where ε is assumed to be i.i.d. Gaussian with mean 0 and variance $\sigma^2$

Now, let $\hat{y}_i$ denote the fitted value of the model for case i. Let r be the $L^p$ norm of the residuals. That is, $$r = \left(\sum_{i=1}^{N^T} (y - \bar{y}_i)^p\right)^{\frac{1}{p}} \tag{6}$$

If $\Phi(S^*) < cxr$, then S* is the best split. Otherwise, the linear model fits better than split form 1 and 2. In this case, the node T is split into d sub-nodes, $T_1, T_2, \ldots, T_d$. Let $\hat{x}_1, \hat{x}_2, \ldots, \hat{x}_{N^T}$ denote the ordered values of $x_1, x_2, \ldots, x_{N^T}$ in an increasing order. Then a case $(x, y) \epsilon T_i$ if $$\hat{x}_{L_1} \leqq x < \hat{x}_{R_i}$$

where $$L_i = \text{floor}\left(\frac{N^T}{d}\right) \times (i-1) + h_1,$$

$$R_i = L_i + \text{floor}\left(\frac{N^T}{d}\right) + h_2,$$

$$h_1 = \max\{i, (N^T \bmod d)\},$$

$$h_2 = \begin{cases} 1 & \text{if } i < N^T \bmod d \\ 0 & \text{Otherwise} \end{cases}$$

where d is a user defined parameter. The default value of d is 4. Now, assigning a value or class to a terminal node will be described.

When a terminal node is reached, a value or a class, f(T), is assigned to all cases in the node depending on the type of the response variable. If the type of the response variable is numerical, f(T) is a real value number. Otherwise, f(T) is set to be a class member of the set $A=\{A_1, A_2, \ldots, A_k\}$. Now, the cost function may be determined if Y is categorical or numerical.

Y is Categorical

Assume Y takes values in set $A=\{A_1, A_2, \ldots, A_k\}$. T is a terminal node with $N^T$ cases. Let $N_i^T$ be the number, Y, equal to $A_i$ in T, $i \epsilon \{1, 2, \ldots, L\}$. If the node is pure (i.e., all the cases in the node has the same response $A_j$), then, $f(T)=A_j$. Otherwise, the node is not pure. No matter which class, $f(T)$, is assigned to, there is at least one case misclassified in the node. Let $u(i|j)$ be the cost of assigning a class j case to class i. Then the total cost of assigning $f(T)$ to node T is $$U(f(T)) = \sum_{i=1}^{N_T} u(f(T) \mid y_i) \tag{7}$$

where $f(T)=A_j$, such that $U(A_j)=\min(U(A_i), i\in\{1,2,\ldots,l\})$

If $u(i|j)$ is constant for all i and j, then $f(T)$ is assigned to the biggest class in the node. When there is a tie for the best choice of $f(T)$ among several classes, $f(T)$ is picked arbitrarily among those classes. Now, the case where Y is numerical is described.

Y is Numerical

In this case, the cost function is the same function $g(T)$ which [measure] *measures* the "noisiness" of the node as described above. $f(T)$ is assigned to the value which minimizes the cost. It can be easily shown that, when $g(T)$ is the $L^2$ norm of the node, $f(T)$ equals to the mean value of the node. Now, the pruning of the decision tree will be described.

By growing an oversized tree as described above, one encounters the problem of over fitting. To deal with this problem, cross validation is used to find the right size of the model. Then, the tree can be pruned to the proper size. Ideally, one would like to split the data into two sets. One for constructing the model and one for testing. But, unless the data set is sufficiently large, using only part of the data set to build the model reduces its accuracy. Therefore, cross validation is the preferred procedure.

An n-fold cross validation procedure starts with dividing the data set into n subsets, $D_1, D_2, \ldots, D_n$. The division is random and each subset contains as nearly as possible, the same number of cases. Let $D_i^c$ denote the compliment set of $D_i$. Then n tree structure models $TR_1, TR_2, \ldots, TR_n$ are built using the $D_1^c, D_2^c, \ldots, D_n^c$. Now we can use the cases in $D_i^c$ to test the validity of $TR_i$ and to find out what is the right size of the tree model.

A measure of the size of a tree structure model, $g(TR)$, the complexity of TR, is defined as follows. Let $T_T$ denote the set of terminal nodes of a tree node T. Let $C(t)$ be the cost function of node t if all nodes under t are pruned. Thus, $$g(T) = \begin{cases} \dfrac{C(T) - C(T_T)}{|T_T| - 1} & \text{if T is not a terminal node} \\ 0 & \text{if T is a terminal node} \end{cases}$$

where $|T_T|$ is the cardinality of $T_T$, and $$C(T_T) = \sum_{i \in T_T} C(t).$$

where $P(t)$ is the probability function.

Next, one can define $$g(TR)=\max(g(T)|T \text{ is a node of } TR)$$

Theorem: Let $T_0$ be the node, such that $g(T_0)=g(TR)$. Then, pruning off all sub-nodes of $T_0$ will not increase the complexity of the tree.

Proof

Let $TR^N$ be the tree obtained by pruning off $T_0$ from TR. Every node $T^N$ in tree $TR^N$ comes from the node T in TR. If we can show that, for every $T^N$, $g(T^N)\leqq g(T)$, then, by definition, $g(TR^N)\leqq g(TR)$.

There are two scenarios. 1) For node $T^N$, its [counter part] *counterpart* T contains $T_0$ as one of its [sub-node] *sub-nodes*. 2) For node $T^N$, its [counter part] *counterpart* T does not contain $T_0$ as a sub-node. In the second scenario, $T^N$ and T [has] *have* the same structure. Therefore, $g(T^N)=g(T)$. Now, let us consider the first scenario. If $T^N$ has no sub-node, then, $g(T^N)=0\leqq g(T)$. Otherwise, by definition, $$g(T^N) = \frac{C(T^N) - C(T_T^N)}{|T_T^N| - 1}$$

$$g(T) = \frac{C(T) - C(T_T)}{|T_T| - 1}.$$

Since, $C(T^N)=C(T)$, $C(T)-C(T_T)-(C(T^N)-C(T_T^N))=C(T_0)-C(T_{0T})$, $|T_T|-1-(|T_T^N|-1)=|T_0|-1$, and $g(T_0)=g(TR)$, therefore, $g(T)\leqq g(T_0)$. Hence, $g(T^N)\leqq g(T)$.

This theorem establishes a relationship between the size of a tree structure model and its complexity $g(TR)$. In general, the bigger the complexity the more the number of nodes of the tree.

Cross validation can point out which complexity value v is likely to produce the most accurate tree structure. Using this v, we can prune the tree generated from the whole data set until its complexity is just below v. This pruned tree is used as the final tree structure model. Now, the model modification step will be described.

In some cases, the predictor variables can be correlated with each other. The splits of a node based on different parameters can produce similar results. In such cases, it is really up to the process engineer who uses the software to identify which parameter is the real cause of the Yield problem. To help the engineer to identify the possible candidates of parameters at any node split, all predictor variables are ranked according to their relative significance if the split were based on them. To be more precise, let $X_i$ be the variable picked by the method which the split, S*, is based on.

For any $j\neq i$ let $S_j$ denote the best split based on $X_j$. Then, define $$q(j) = \frac{\Phi(S_j)}{\Phi(S^*)}$$

Figure 7:
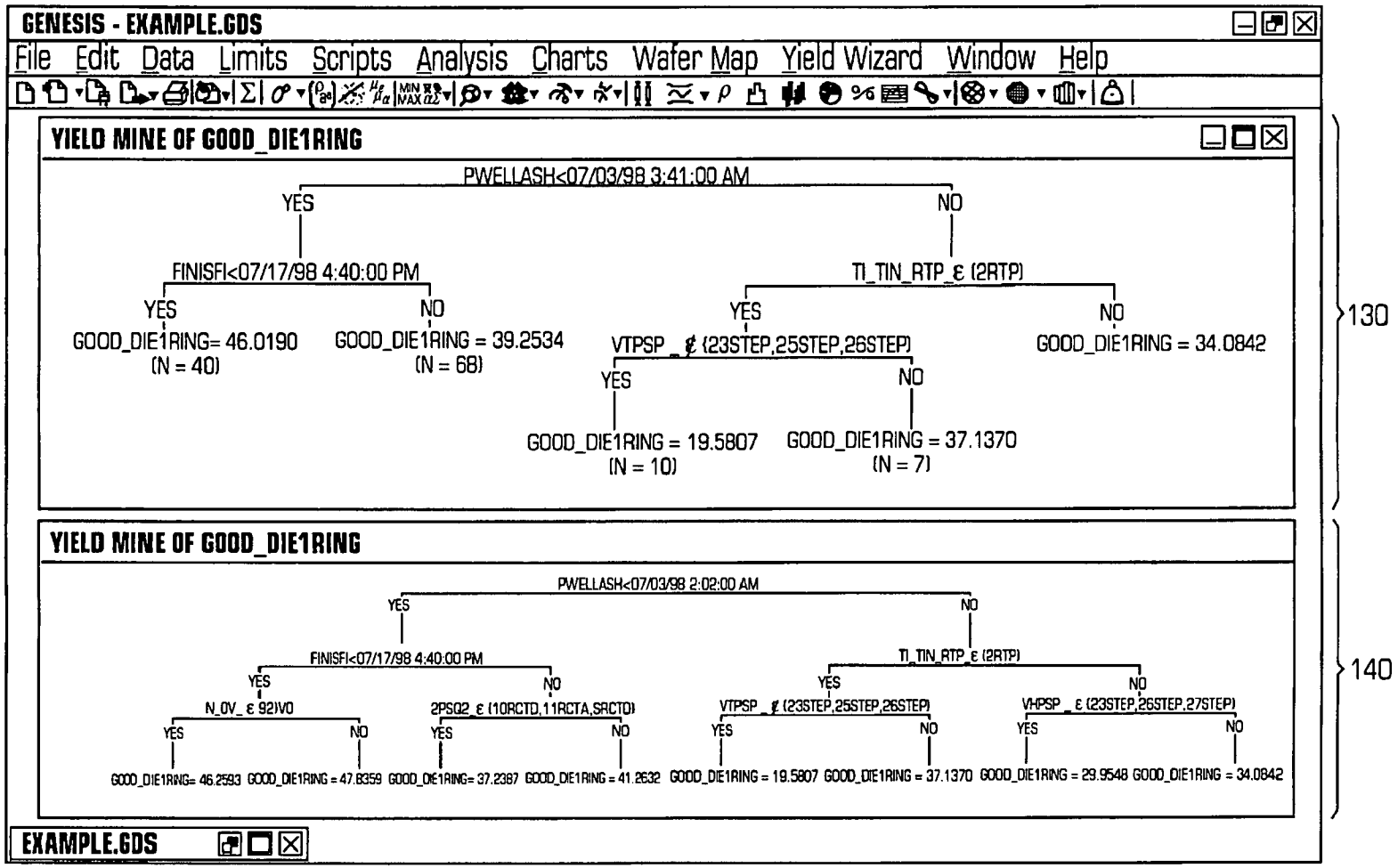
FIG. 7 [illustrate] *illustrates* an example of a yield parameter being selected by the user and a tree being automatically generated by the system based on the user selected parameter in accordance with the invention.

Since S* is the best split $0\leqq q(i)\leqq 1$ . Then, when double clicking on a node, a list of all predictor variables ranked by their q values is shown as illustrated in FIG. 5. If the user decides it is more appropriate to split on a predictor variable other than the one picked by the method, the user can then highlight it from the list, and a single click of the mouse will reproduce the tree and force node T to be split based on user picked parameters. For example, FIG. 7 illustrates two trees 130, 140 wherein the first tree 130 is built using the PWELLASH variable selected by the method and the second tree 140 is built using the user-selected parameter PWELLCB. Now, a method for tree prediction in accordance with the invention will be described in more detail.

Figure 8:
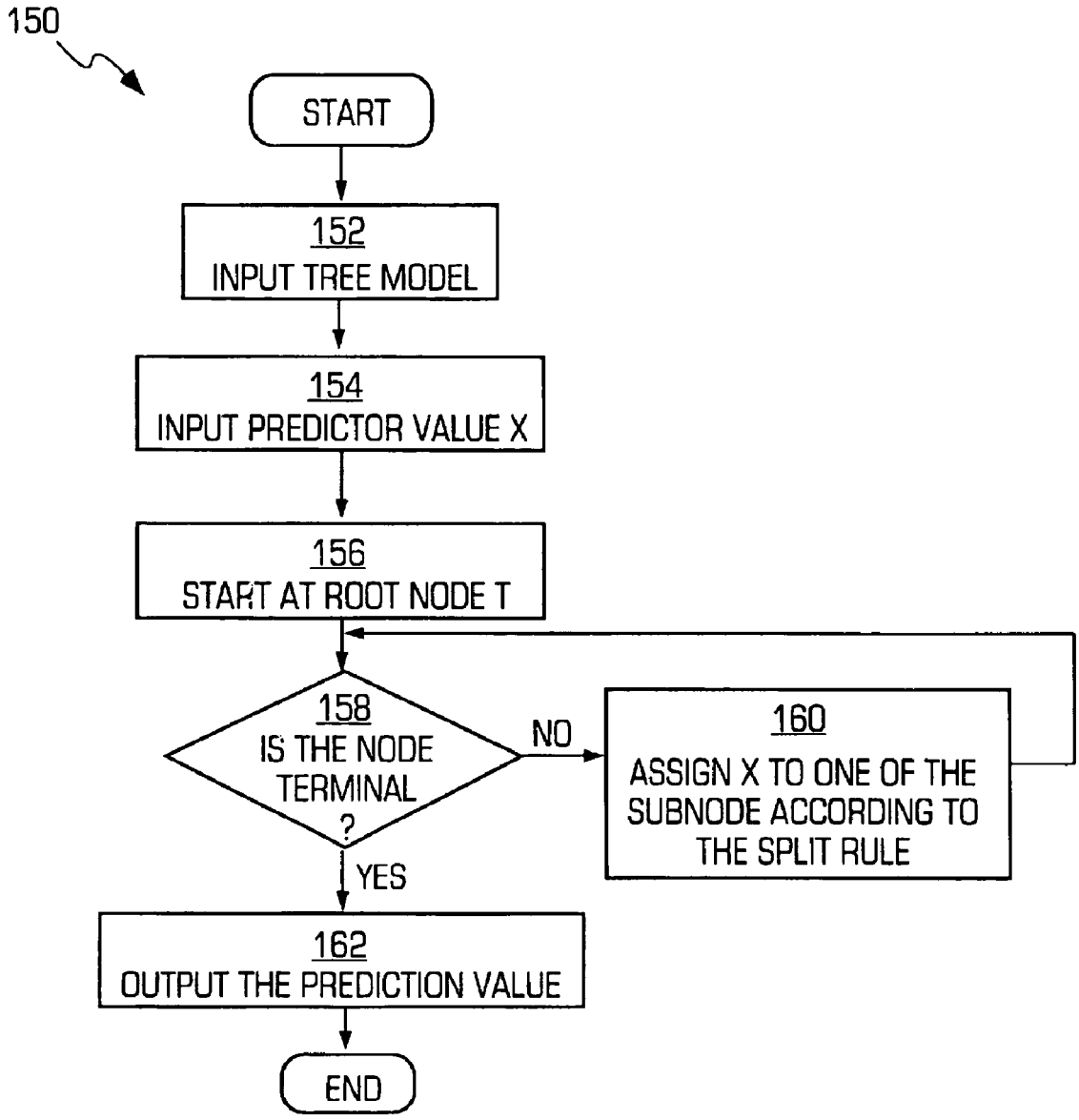
FIG. 8 is a flowchart illustrating a method for tree prediction in accordance with the invention.

FIG. 8 is a flowchart illustrating a method 150 for tree prediction in accordance with the invention. In step 152, the previously generated tree model is input. Next, the prediction value, X, of interest is input. In step 156, the prediction using the tree starts at the root node, T. In step 158, the method may determine if the node is terminal. If the current node is not terminal, then the method may assign X to one of the sub-nodes in step 160 according to the split rule described above. After the assignment in step 160, the method loops back to step 158 to test if the next node is a terminal node. If the node is terminal, then the method outputs the prediction value in step 162 and the method is completed. Now, the analysis step in accordance with the invention will be described.

Figure 9:
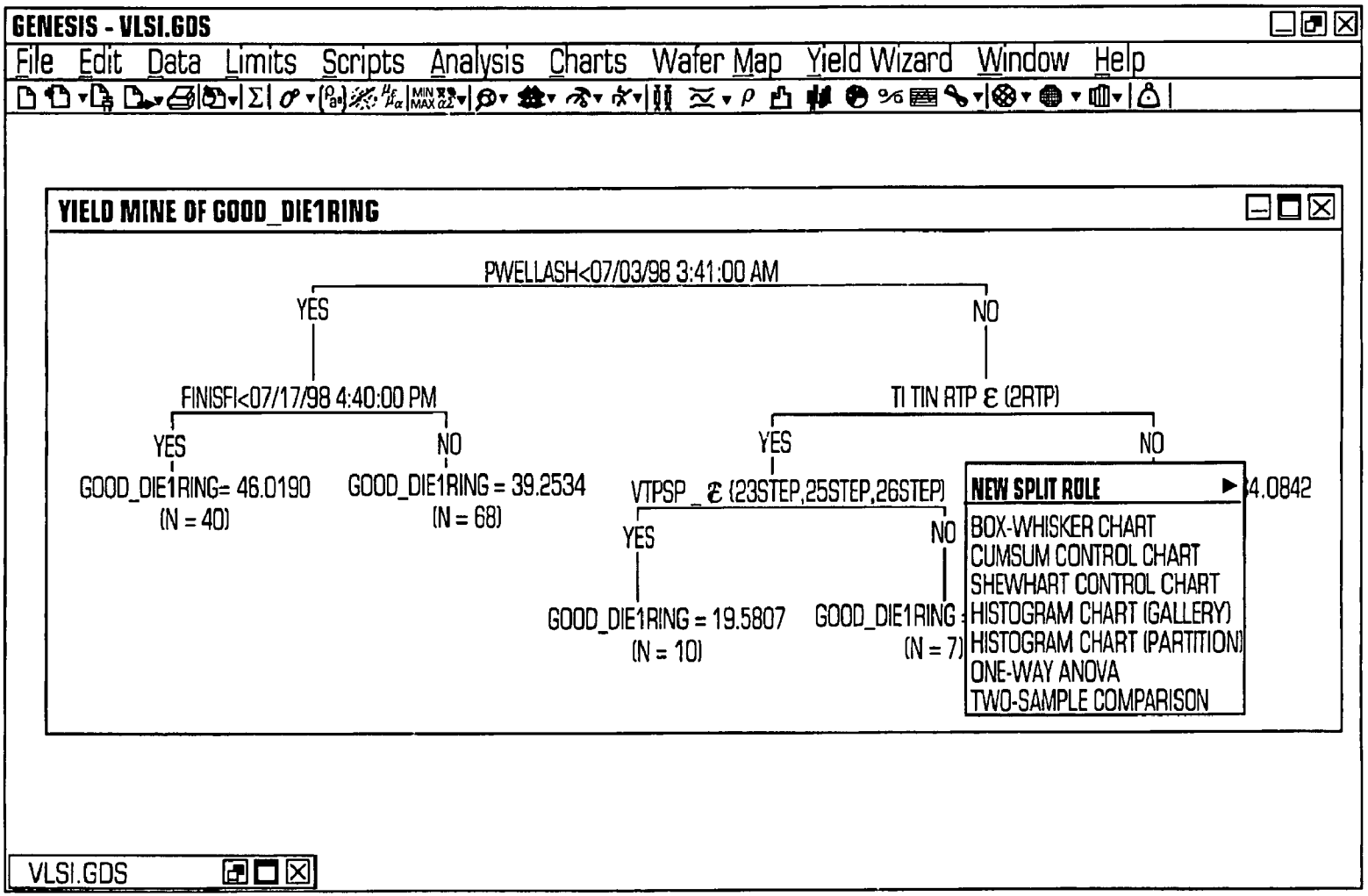
FIG. 9 illustrates an example of the statistical tools available to the user in accordance with the invention.

All the basic statistical analysis tools are available to help the user to validate the model and identify the yield problem. At each node, a right click of the mouse produces a list of tools available as shown in FIG. 9. Every analysis is done at the node level (i.e., it only uses the data from that particular node). An example of the analysis tools available at the right node after the first split is shown in FIG. 9. In this example, those analysis tools may include box-whisker chart, Cumsum control chart, Shewhet control chart, histogram, one-way ANOVA, two sample comparison and X-Y correlation analysis. The particular tools available to the user depend upon the nature of the X and Y parameters (e.g., continuous vs. categorical).

After each model is built, the tree can be saved for future predictions. If a new set of parameter values is available, it can be fed into the model and generate prediction of the response value for each case. This functionality can be very handy for the user.

While the foregoing has been with reference to a particular embodiment of the invention, it will be appreciated by those skilled in the art that changes in this embodiment may be made without departing from the principles and spirit of the invention, the scope of which is defined by the appended claims.

We claim:

1. A *computerized* yield management system, comprising:

*pre-processing computing device* means *executed by a data pre-processor in a computer processing unit* for pre-processing an input data set comprising one or more prediction variables and one or more response variables containing data about a particular semiconductor process, the pre-processing *computing device* means further comprising means for removing *one or more* prediction variables *from the input data set* having more than a predetermined number of missing values, means for removing *one or more* prediction variables *from the input data set* having more than a predetermined number of classes, and means for removing data having more than a predetermined number of missing values to generate pre-processed data;

*model generating computer device* means *executed by a model builder in the computer processing unit, the model builder being in communication with the data pre-processor,* for generating a model based on the pre-processed data, the model being a decision tree;

*computing device* means *executed by the model builder* for modifying the model based on user input; and

*computing device* means *executed by a statistical tool library in the computer processing unit, the statistical tool library being in communication with the model builder,* for analyzing the model using a statistical tool to generate one or more key yield factors based on the input data set.

2. The system of claim 1, wherein the model generating *computing device* means further comprises means for building a decision tree containing a root node, one or more intermediate nodes and one or more terminal nodes wherein a response value at the *one or more* terminal nodes is presented to the user and *splitting* means for splitting a node in the tree into one or more sub-nodes based on prediction variables contained in the node.

3. The system of claim 2, wherein the splitting means further comprises means for determining if a number of data cases in a node are less than a predetermined threshold value, means for calculating a goodness of split value for splitting the node based on each [predictor] *prediction* variable in the node, means for selecting prediction variables having a maximum goodness of split value and means for splitting the node into one or more sub-nodes based on the prediction variables having the maximum goodness of split value.

4. The system of claim 3, wherein the *one or more* prediction variables and the *one or more* response variables are categorical variables.

5. The system of claim 4, wherein the splitting means further comprises a splitting rule and a goodness of split rule, the splitting rule comprising means for placing a case into a left sub-node if the case is included in the values of the [predictor] *prediction* variable and wherein the goodness of split rule is of the form:

$$\Phi(s) = g(T) - \frac{N^{T_L}}{N^T} g(T_L) - \frac{N^{T_R}}{N^T} g(T_R)$$

where $\Phi(s)$ represents a goodness of split rule for a split, s; $g(T)$ represents noisiness of a node T; $g(T_L)$ represents noisiness of a left sub-node of node T; $g(T_R)$ represents noisiness of a right sub-node of node T; $N^T$ is a number of cases in node T; $N^{T_L}$ is a number of cases in a left sub-node of node T; and $N^{T_R}$ is a number of cases in a right sub-node of node T.

6. The system of claim 3, wherein the *one or more* prediction *variables* and *the one or more* response variables are numerical.

7. The system of claim 6, wherein the splitting means further comprises a splitting rule and a goodness of split rule, the splitting rule comprising means for placing a case into a left sub-node if the value of the [predictor] *prediction* variable for a particular case is less than or equal to a first predetermined value of the [predictor] *prediction* variables or if the value of the [predictor] *prediction* variable for the particular case is between the first predetermined value and a second predetermined value of the [predictor] *prediction* variables and wherein the goodness of split rule is of the form:

$$\Phi(S^*) = \begin{cases} g(T) - \frac{N^{T_L}}{N^T} g(T_L) - \frac{N^{T_R}}{N^T} g(T_R) & \text{if } S^* \text{ has a first form} \\ c\left(g(T) - \frac{N^{T_L}}{N^T} g(T_L) - \frac{N^{T_R}}{N^T} g(T_R)\right) & \text{if } S^* \text{ has a second form} \end{cases}$$

where $\Phi(S^*)$ represents a goodness of split rule for a split, S*; $g(T)$ represents noisiness of a node T; $g(T_L)$ represents noisiness of a left sub-node of node T; $g(T_R)$ represents noisiness of a right sub-node of node T; $N^T$ is a number of cases in node T; $N^{T_L}$ is a number of cases in a left sub-node of node T; $N^{T_R}$ is a number of cases in a right sub-node of node T; c is a user-selectable variable between 0 and 1.

8. The system of claim 3, wherein [the] *a* response variable *from the one or more response variables* is a categorical variable and [the] *a* prediction variable *from the one or more prediction variables* is a numerical variable.

9. The system of claim 8, wherein the splitting means further comprises a splitting rule and a goodness of split rule, the splitting rule comprising means for placing a case into a left sub-node if the value of the [predictor] *prediction* variable for a particular case is less than or equal to a first predetermined value of the [predictor] *prediction* variables or if the value of the [predictor] *prediction* variable for the particular case is between the first predetermined value and a second predetermined value of the [predictor] *prediction* variables and wherein the goodness of split rule is of the form:

$$\Phi(S) = \begin{cases} g(T) - \frac{N^{T_L}}{N^T} g(T_L) - \frac{N^{T_R}}{N^T} g(T_R) & \text{if S has a first form} \\ c\left(g(T) - \frac{N^{T_L}}{N^T} g(T_L) - \frac{N^{T_R}}{N^T} g(T_R)\right) & \text{if S has a second form} \end{cases}$$

where $\Phi(S)$ represents a goodness of split rule for a split, S; $g(T)$ represents noisiness of a node T; $g(T_L)$ represents noisiness of a left sub-node of node T; $g(T_R)$ represents noisiness of a right sub-node of node T; $N^T$ is a number of cases in node T; $N^{T_L}$ is a number of cases in the left sub-node of node T; $N^{T_R}$ is a number of cases in the right sub-node of node T; c is a user-selectable variable between 0 and 1.

10. The system of claim 3, wherein [the] *a* response variable *from the one or more response variables* is a numerical variable and [the] *a* prediction variable *from the one or more prediction variables* is a categorical variable.

11. The system of claim 10, wherein the splitting means further comprises a splitting rule and a goodness of split rule, the splitting rule comprising means for placing a case into a left sub-node if the case is included in the values of the [predictor] *prediction* variable and wherein the goodness of split rule is of the form:

$$\Phi(s) = g(T) - \frac{N^{T_L}}{N^T} g(T_L) - \frac{N^{T_R}}{N^T} g(T_R)$$

where $\Phi(s)$ represents a goodness of split rule for a split, s; $g(T)$ represents noisiness of a node T; $g(T_L)$ represents noisiness of a left sub-node of node T; $g(T_R)$ represents noisiness of a right sub-node of node T; $N^T$ is a number of cases in node T; $N^{T_L}$ is a number of cases in the left sub-node of node T; and $N^{T_R}$ is a number of cases in the right sub-node of node T.

12. A yield management method, comprising:

pre-processing, *via a computing device,* an input data set comprising one or more prediction variables and one or more response variables containing data about a particular semiconductor process, the pre-processing further comprising removing *one or more* prediction variables *from the input data set* having more than a predetermined number of missing values, removing *one or more* prediction variables *from the input data set* having more than a predetermined number of classes and removing data having more than a predetermined number of missing values to generate pre-processed data;

generating, *via the computing device,* a model based on the pre-processed data, the model being a decision tree;

modifying, *via the computing device,* the model based on user input; and analyzing, *via the computing device,* the model using statistical tools to examine one or more key yield factors based on the input data set.

13. The method of claim 12, wherein the generated model further comprises building a decision tree containing a root node, one or more intermediate nodes and one or more terminal nodes wherein a response value at the *one or more* terminal nodes is presented to the user and splitting a node in the tree into one or more sub-nodes based on prediction variables contained in the node.

14. The method of claim 13, wherein the splitting further comprises determining if a number of data cases in a node are less than a predetermined threshold value, calculating a goodness of split value for splitting the node based on each [predictor] *prediction* variable in the node, selecting prediction variables having a maximum goodness of split value and splitting the node into one or more sub-nodes based on the prediction variables having the maximum goodness of split value.

15. The method of claim 14, wherein the *one or more* prediction variables and the *one or more* response variables are categorical variables.

16. The method of claim 15, wherein the splitting further comprises a splitting rule and a goodness of split rule, the splitting rule comprising placing a case into a left sub-node if the case is included in the values of the [predictor] *prediction* variable and wherein the goodness of split rule is of the form:

$$\Phi(s) = g(T) - \frac{N^{T_L}}{N^T} g(T_L) - \frac{N^{T_R}}{N^T} g(T_R)$$

where $\Phi(s)$ represents a goodness of split rule for a split, s; $g(T)$ represents noisiness of a node T; $g(T_L)$ represents noisiness of a left sub-node of node T; $g(T_R)$ represents noisiness of a right sub-node of node T; $N^T$ is a number of cases in node T; $N^{T_L}$ is a number of cases in the left sub-node of node T; and $N^{T_R}$ is a number of cases in the right sub-node of node T.

17. The method of claim 14, wherein the *one or more* prediction *variables* and *the one or more* response variables are numerical.

18. The method of claim 17, wherein the splitting further comprises a splitting rule and a goodness of split rule, the splitting rule comprising placing a case into a left sub-node if the value of the [predictor] *prediction* variable for a particular case is less than or equal to a first predetermined value of the [predictor] *prediction* variables or if the value of the [predictor] *prediction* variable for the particular case is between the first predetermined value and a second predetermined value of the [predictor] *prediction* variables and wherein the goodness of split rule is of the form:

$$\Phi(S^*) = \begin{cases} g(T) - \frac{N^{T_L}}{N^T} g(T_L) - \frac{N^{T_R}}{N^T} g(T_R) & \text{if } S^* \text{ has a first form} \\ c\left(g(T) - \frac{N^{T_L}}{N^T} g(T_L) - \frac{N^{T_R}}{N^T} g(T_R)\right) & \text{if } S^* \text{ has a second form} \end{cases}$$

where $\Phi(S^*)$ represents a goodness of split rule for a split, $S^*$; $g(T)$ represents noisiness of a node T; $g(T_L)$ represents noisiness of a left sub-node of node T; $g(T_R)$ represents noisiness of a right sub-node of node T; $N^T$ is a number of cases in node T; $N^{T_L}$ is a number of cases in a left sub-node of node T; $N^{T_R}$ is a number of cases in a right sub-node of node T; c is a user-selectable variable between 0 and 1.

19. The method of claim 14, wherein [the] *a* response variable *from the one or more response variables* is a categorical variable and [the] *a* prediction variable *from the one or more prediction variables* is a numerical variable.

20. The method of claim 19, wherein the splitting further comprises a splitting rule and a goodness of split rule the splitting rule comprising placing a case into a left sub-node if the value of the [predictor] *prediction* variable for a particular case is less than or equal to a first predetermined value of the [predictor] *prediction* variables or if the value of the [predictor] *prediction* variable for the particular case is between the first predetermined value and a second predetermined value of the [predictor] *prediction* variables and wherein the goodness of split rule is of the form:

$$\Phi(S) = \begin{cases} g(T) - \frac{N^{T_L}}{N^T} g(T_L) - \frac{N^{T_R}}{N^T} g(T_R) & \text{if S has a first form} \\ c\left(g(T) - \frac{N^{T_L}}{N^T} g(T_L) - \frac{N^{T_R}}{N^T} g(T_R)\right) & \text{if S has a second form} \end{cases}$$

where $\Phi(S)$ represents a goodness of split rule for a split, S; g(T) represents noisiness of a node T; $g(T_L)$ represents noisiness of a left sub-node of node T; $g(T_R)$ represents noisiness of a right sub-node of node T; $N^T$ is a number of cases in node T; $N^{T_L}$ is a number of cases in the left sub-node of node T; $N^{T_R}$ is a number of cases in the right sub-node of node T; c is a user-selectable variable between 0 and 1.

21. The method of claim 14, wherein [the] *a* response variable *from the one or more response variables* is a numerical variable and [the] *a* prediction variable *from the one or more prediction variables* is a categorical variable.

22. The method of claim 21, wherein the splitting further comprises a splitting rule and a goodness of split rule, the splitting rule comprising placing a case into a left sub-node if the case is included in the values of the [predictor] *prediction* variable and wherein the goodness of split rule is of the form:

$$\Phi(s) = g(T) - \frac{N^{T_L}}{N^T} g(T_L) - \frac{N^{T_R}}{N^T} g(T_R)$$

where $\Phi(s)$ represents a goodness of split rule for a split, s; g(T) represents noisiness of a node T; $g(T_L)$ represents noisiness of a left sub-node of node T; $g(T_R)$ represents noisiness of a right sub-node of node T; $N^T$ is a number of cases in node T; $N^{T_L}$ is a number of cases in the left sub-node of node T; and $N^{T_R}$ is a number of cases in the right sub-node of node T.

*23. A computerized yield management system, comprising:*

*pre-processing computing device means executed by a data pre-processor in a computer processing unit for pre-processing an input data set comprising one or more prediction variables and one or more response variables containing data about a particular semiconductor process to remove data having at least a predetermined number of missing values to generate pre-processed data, and the pre-processing computing device means comprising means for removing one or more prediction variables from the input data set having more than a predetermined number of classes;*

*computing device means executed by a model builder in the computer processing unit, the model builder being in communication with the data pre-processor, for generating a model based on the pre-processed data, the model being a decision tree identifying one or more variables as key yield factors; and*

*computing device means executed by a statistical tool library in the computer processing unit, the statistical tool library being in communication with the model builder, for analyzing the model using a statistical tool to examine one or more key yield factors based on the input data set.*

*24. The system of claim 23 wherein the pre-processing computing device means further comprises means for removing one or more prediction variables from the input data set having more than a predetermined number of missing values.*

*25. The system of claim 23 wherein the pre-processing computing device means further comprises means for removing data having more than a predetermined number of missing values.*

*26. The system of claim 23, further comprising means for modifying the model based on user input.*

*27. A yield management method, comprising:*

*pre-processing, via a computing device, an input data set comprising one or more prediction variables and one or more response variables containing data about a particular semiconductor process to remove data having at least a predetermined number of missing values to generate pre-processed data, the pre-processing further comprising removing one or more prediction variables from the input data set having more than a predetermined number of classes;*

*generating, via the computing device, a model based on the pre-processed data, the model being a decision tree identifying one or more variables as key yield factors; and*

*analyzing the model using a statistical tool to examine one or more key yield factors based on the input data set.*

*28. The method of claim 27 wherein the pre-processing further comprises removing one or more prediction variables from the input data set having more than a predetermined number of missing values.*

*29. The method of claim 27 wherein the pre-processing further comprises removing data having more than a predetermined number of missing values.*

*30. The method of claim 27, further comprising modifying the model based on user input.*

*31. A computerized yield management system, comprising:*

*pre-processing computing device means executed by a data pre-processor in a computer processing unit for pre-processing an input data set comprising one or more prediction variables and one or more response variables containing data about a particular semiconductor process to remove data having at least a predetermined number of missing values to generate pre-processed data, and the pre-processing computing device means comprising means for removing one or more prediction variables from the input data set having more than a predetermined number of classes;*

*computing device means executed by a model builder in the computer processing unit, the model builder being in communication with the data pre-processor, for generating a model based on the pre-processed data, the model being a decision tree identifying one or more variables as key yield factors; and*

*computing device means executed by a statistical tool in the computer processing unit, the statistical tool being in*

*communication with the model builder, for analyzing the model using the statistical tool to generate yield management information.*

*32. The system of claim 31 wherein the pre-processing computing device means further comprises means for removing data containing erroneous values.*

*33. The system of claim 31 wherein the pre-processing computing device means further comprises means for removing data containing invalid values.*

*34. The system of claim 31, further comprising means for modifying the model based on user input.*

* * * * *